(12) United States Patent
Fan et al.

(10) Patent No.: US 10,379,528 B2
(45) Date of Patent: Aug. 13, 2019

(54) METHOD AND APPARATUS FOR GENERATING MACHINING CODES OF WORKPIECES FROM A PAPER ENGINEERING DRAWING

(71) Applicant: Siemens Aktiengesellschaft, Munich (DE)

(72) Inventors: Shun Jie Fan, Beijing (CN); Ming Jie, Beijing (CN); Qian Wang, Beijing (CN)

(73) Assignee: Siemens Aktiengesellschaft, Munich (DE)

( * ) Notice: Subject to any disclaimer, the term of this patent is extended or adjusted under 35 U.S.C. 154(b) by 42 days.

(21) Appl. No.: 15/527,048

(22) PCT Filed: Dec. 1, 2014

(86) PCT No.: PCT/CN2014/092709
§ 371 (c)(1),
(2) Date: May 16, 2017

(87) PCT Pub. No.: WO2016/086344
PCT Pub. Date: Jun. 9, 2016

(65) Prior Publication Data
US 2017/0343997 A1  Nov. 30, 2017

(51) Int. Cl.
*G05B 19/42* (2006.01)
*G05B 19/4093* (2006.01)
(Continued)

(52) U.S. Cl.
CPC ..... *G05B 19/4202* (2013.01); *G05B 19/4093* (2013.01); *G05B 19/4097* (2013.01);
(Continued)

(58) Field of Classification Search
CPC .............. G05B 19/4097; G05B 19/414; G05B 19/4145; G05B 2219/33099;
(Continued)

(56) References Cited

U.S. PATENT DOCUMENTS

| 4,121,284 A * | 10/1978 | Hyatt ................. B60R 16/0373 341/24 |
| 4,181,954 A * | 1/1980 | Rosenthal ............ G06F 17/509 358/1.3 |
| 5,832,119 A * | 11/1998 | Rhoads ................ G06K 7/1417 382/232 |
| 6,311,100 B1 * | 10/2001 | Sarma ................ G05B 19/4097 700/186 |
| 7,269,471 B2 | 9/2007 | Kadono |

(Continued)

FOREIGN PATENT DOCUMENTS

| CN | 1097878 A | 1/1995 |
| CN | 1624688 A | 6/2005 |

(Continued)

OTHER PUBLICATIONS

International Search Report PCT/ISA/210 for International Application No. PCT/CN2014/092709 dated Sep. 11, 2015.
(Continued)

*Primary Examiner* — Aklilu K Woldemariam
(74) *Attorney, Agent, or Firm* — Harness, Dickey & Pierce, P.L.C.

(57) ABSTRACT

A method and apparatus for generating machining code of workpieces from a paper engineering drawing are provided. The method includes processing the paper engineering drawing to be a binary image; extracting dimension features and shape features of the workpieces from the binary image; and generating the machining codes of the workpieces based on the extracted dimension features and shape features of the workpieces. The machining codes indicate the dimension
(Continued)

and shape of the workpieces. Machining codes of workpieces are generated from a paper engineering drawing directly without manual involvement.

10 Claims, 4 Drawing Sheets

(51) Int. Cl.
*G05B 19/4097* (2006.01)
*G06F 17/50* (2006.01)
(52) U.S. Cl.
CPC .......... *G06F 17/50* (2013.01); *G05B 2219/30* (2013.01); *G05B 2219/35216* (2013.01); *G05B 2219/37572* (2013.01); *Y02P 90/265* (2015.11)
(58) Field of Classification Search
CPC ........... G05B 2219/35012; G05B 2219/35168; G05B 2219/35219; G05B 19/4093; G05B 19/40937; G05B 19/41; G05B 2219/35086; G05B 19/4202; G05B 2219/30; G05B 2219/35216; G05B 2219/37572; G05B 19/4069; G05B 2219/35148; G05B 2219/35009; G05B 2219/35287; Y02P 90/265; G06F 17/50; G06F 17/509; G06F 2217/34; G06F 17/5009; G06F 17/5086; G06T 17/00; G06T 17/10; G06T 19/00; G07D 7/004; G07D 7/12; G07D 7/20; G06K 2017/0045; G06K 2209/40; G06K 9/00577; G06K 9/20; G06K 9/2063; G06K 9/3216; G06K 9/4661; G07B 2017/00443; G07B 2017/00653; G07B 2017/00766; A61B 6/032; G01N 2223/419; G01N 23/046; C04B 41/00; C04B 41/0036; C04B 41/0045; C04B 41/009; C04B 14/00; B23K 26/032

USPC ......... 345/419; 382/100, 118; 700/159, 182, 700/184, 160, 96
See application file for complete search history.

(56) References Cited

U.S. PATENT DOCUMENTS

| | | | |
|---|---|---|---|
| 7,655,882 B2* | 2/2010 | Kaplan | B23K 26/032 219/121.68 |
| 8,319,145 B2* | 11/2012 | Rosario | B23K 15/08 219/121.19 |
| 2003/0219145 A1* | 11/2003 | Smith | G06K 9/00577 382/100 |
| 2003/0219157 A1* | 11/2003 | Koide | G06K 9/00986 382/173 |
| 2004/0162839 A1* | 8/2004 | Udeshi | G06T 17/005 |
| 2010/0118027 A1* | 5/2010 | Weiss | A61B 6/032 345/419 |
| 2010/0298961 A1* | 11/2010 | Frisken | G05B 19/4069 700/103 |
| 2010/0298967 A1* | 11/2010 | Frisken | G06T 17/10 700/173 |
| 2013/0262065 A1* | 10/2013 | Erdim | G05B 19/4069 703/7 |
| 2013/0338807 A1 | 12/2013 | De Schepper | |
| 2017/0343997 A1* | 11/2017 | Fan | G05B 19/4202 |

FOREIGN PATENT DOCUMENTS

| | | |
|---|---|---|
| CN | 1862432 A | 11/2006 |
| CN | 102495584 A | 6/2012 |
| CN | 103434136 A | 12/2013 |

OTHER PUBLICATIONS

Written Opinion of the International Searching Authority PCT/ISA/237 for International Application No. PCT/CN2014/092709 dated Sep. 11, 2015.

* cited by examiner

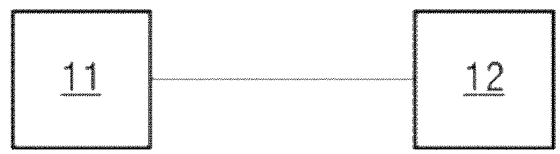
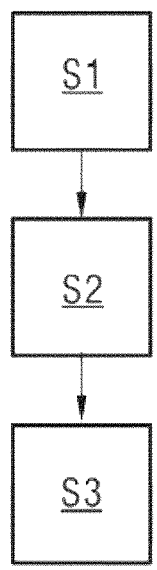
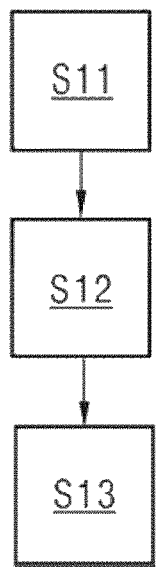

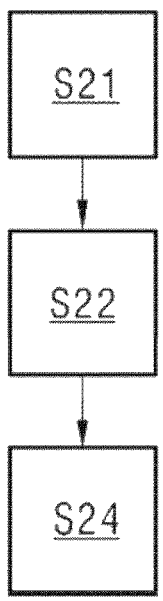
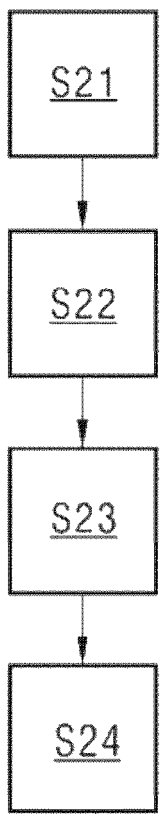

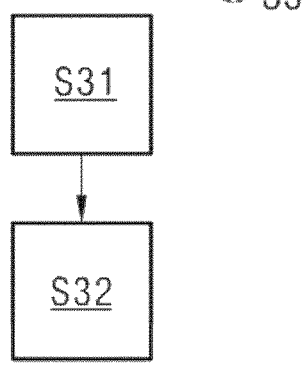
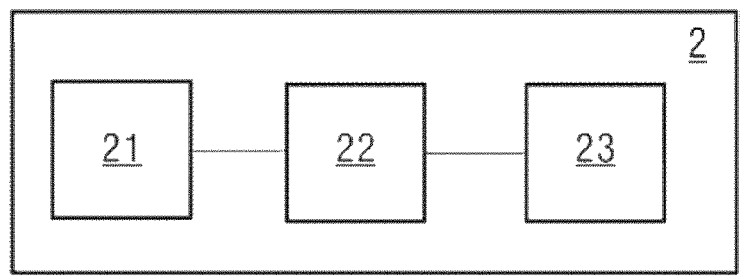
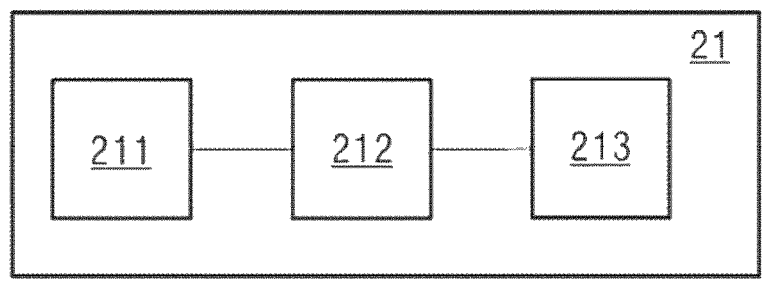
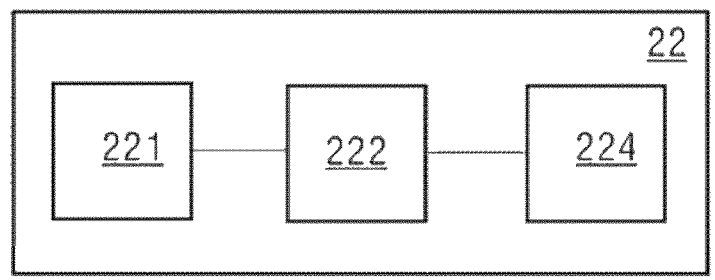

METHOD AND APPARATUS FOR GENERATING MACHINING CODES OF WORKPIECES FROM A PAPER ENGINEERING DRAWING

PRIORITY STATEMENT

This application is the national phase under 35 U.S.C. § 371 of PCT International Application No. PCT/CN2014/092709 which has an International filing date of Dec. 1, 2014, which designated the United States of America, the entire contents of which are hereby incorporated herein by reference.

FIELD

Embodiments of the present invention generally to computer numerical control (CNC) field, and in particular to a method and/or apparatus for generating machining codes of workpieces from a paper engineering drawing.

BACKGROUND

A paper engineering drawing is widely used by manufacturers who machines workpieces by way of computer numerical control. Generally, a mechanist determines machining codes of the workpieces based on the paper engineer drawing. Then, the mechanist inputs the machining codes into a CNC machine, which automatically machines workpieces conforming to dimension and shape of the workpieces shown in the paper engineer drawing.

SUMMARY

An embodiment of the present invention provides a technology for generating machining codes of workpieces from a paper engineering drawing directly without manual intervening.

An embodiment of an aspect of the present invention provides a method for generating machining codes of workpieces from a paper engineering drawing, the machining codes indicating the dimension and shape of the workpieces, the method comprising: processing the paper engineering drawing to be a binary image; extracting dimension features and shape features of the workpieces from the binary image; and generating the machining codes of the workpieces based on the extracted dimension features and shape features of the workpieces.

An embodiment of another aspect of the present invention provides an apparatus for generating machining codes of workpieces from a paper engineering drawing, the machining codes indicating the dimension and shape of the workpieces, the apparatus comprising: a processing unit configured to process the paper engineering drawing to be a binary image; an extracting unit configured to extract dimension features and shape features of the workpieces from the binary image; and a generating unit configured to generate the machining codes of the workpieces based on the extracted dimension features and shape features of the workpieces.

An embodiment of another aspect of the present invention provides a device for generating machining codes of workpieces from a paper engineering drawing, comprising: a storage for storing executable instructions; a processor for performing operations in the above mentioned method for generating machining codes of workpieces from a paper engineering drawing according to the executable instructions stored in the storage.

An embodiment of another aspect of the present invention provides a machine readable medium with executable instructions stored thereon which, when executed, enables a machine to perform operations in the above mentioned method for generating machining codes of workpieces from a paper engineering drawing.

An embodiment of an aspect of the present invention provides a method for generating machining codes of workpieces from a paper engineering drawing, the machining codes indicating the dimension and shape of the workpieces, the method comprising: processing the paper engineering drawing to be a binary image; extracting dimension features and shape features of the workpieces from the binary image; and generating the machining codes of the workpieces based on the extracted dimension features and shape features of the workpieces.

Optionally, the step of processing the paper engineering drawing to be a binary image comprises: obtaining an RGB image of the paper engineering drawing; converting the RGB image to a gray level image; converting the gray level image to the binary image by comparing gray levels of pixels in the gray level image with a gray level threshold, and converting pixels with gray levels above the gray level threshold to pure black pixels while converting pixels with gray levels below the gray level threshold to pure white pixels.

Optionally, the step of extracting dimension features and shape features of the workpieces from the binary image comprises: recognizing dimension features of the workpieces from the binary image; removing the recognized dimension features from the binary image; recognizing shape features of the workpieces from the remaining binary image with the recognized dimension features removed.

Optionally, the step of extracting dimension features and shape features of the workpieces from the binary image further comprises: shrinking widths of lines in the remaining binary image with the recognized dimension features removed to a pixel width.

Optionally, the shape features of the workpieces comprise line functions and endpoints of segments, wherein outline of a workpiece is divided into segments, and a line function of a segment is different from that of another segment next thereto.

Optionally, the step of generating the machining codes of the workpieces based on the extracted dimension features and shape features of the workpieces comprises: interpreting the extracted dimension features and shape features of the workpieces; generating the machining codes of workpieces based on interpretation of the extracted dimension feature and shape features of the workpieces.

An embodiment of another aspect of the present invention provides an apparatus for generating machining codes of workpieces from a paper engineering drawing, the machining codes indicating the dimension and shape of the workpieces, the apparatus comprising: a processing unit configured to process the paper engineering drawing to be a binary image; an extracting unit configured to extract dimension features and shape features of the workpieces from the binary image; and a generating unit configured to generate the machining codes of the workpieces based on the extracted dimension features and shape features of the workpieces.

Optionally, the processing unit comprises: an obtaining sub-unit configured to obtain an RGB image of the paper engineering drawing; a first converting sub-unit configured to convert the RGB image to a gray level image; a second converting sub-unit configured to convert the gray level image to the binary image by comparing gray levels of pixels in the gray level image with a gray level threshold, and converting pixels with gray levels above the gray level threshold to pure black pixels while converting pixels with gray levels below the gray level threshold to pure white pixels.

Optionally, the extracting unit comprises: a first recognizing sub-unit configured to recognize dimension features of the workpieces from the binary image; a removing sub-unit configured to remove the recognized dimension features from the binary image; a second recognizing sub-unit configured to recognize shape features of the workpieces from the remaining binary image with the recognized dimension features removed.

Optionally, the extracting unit further comprises: a shrinking sub-unit 223 configured to shrink widths of lines in the remaining binary image with the recognized dimension features removed to a pixel width.

Optionally, the shape features of the workpieces comprise line functions and endpoints of segments, wherein outline of a workpiece is divided into segments, and a line function of a segment is different from that of another segment next thereto.

Optionally, the generating unit comprises: an interpreting sub-unit configured to interpret the extracted dimension features and shape features of the workpieces; a generating sub-unit configured to generate the machining codes of workpieces based on interpretation of the extracted dimension feature and shape features of the workpieces.

An embodiment of another aspect of the present invention provides a device for generating machining codes of workpieces from a paper engineering drawing, comprising: a storage for storing executable instructions; a processor for performing operations in the above mentioned method for generating machining codes of workpieces from a paper engineering drawing according to the executable instructions stored in the storage.

An embodiment of another aspect of the present invention provides a machine readable medium with executable instructions stored thereon which, when executed, enables a machine to perform operations in the above mentioned method for generating machining codes of workpieces from a paper engineering drawing.

In an embodiment of the present invention, the paper engineering drawing is processed to be a binary image, and then the dimension features and shape features of the workpieces can be extracted from the binary image. By this, the machining codes of workpieces can be automatically generated from the paper engineering drawing. As a result, it is not necessary for a mechanist to bear in mind all possible correspondences between the machining codes and the dimension features and shape features of the workpieces. Thus, efficiency of generating machining codes of workpieces from a paper engineering drawing is improved.

Further, in the embodiment of the present invention, the paper engineering drawing is processed to be a binary image, thus solving the problem that a colorful image is hard to process during later procedures.

BRIEF DESCRIPTION OF THE DRAWINGS

Other objectives, characteristics and advantages of the present invention are made more evident according to perusal of the following detailed description of example embodiment (s) in conjunction with accompanying drawings, in which same or similar reference signs in accompanying drawings denote same or similar elements:

FIG. 1 illustrates a computer numerical control (CNC) system according to an embodiment of the present invention.

FIG. 2 is a flow chart of a method for generating machining codes of workpieces from a paper engineering drawing according to an embodiment of the present invention.

FIG. 3 is a detailed flow chart of the step of processing the paper engineering drawing to be a binary image according to an embodiment of the present invention.

FIG. 4 is a detailed flow chart of the step of extracting dimension features and shape features of the workpieces from the binary image according to an embodiment of the present invention.

FIG. 5 is a detailed flow chart of the step of extracting dimension features and shape features of the workpieces from the binary image according to another embodiment of the present invention.

FIG. 6 is a detailed flow chart of the step of generating the machining codes of the workpieces based on the extracted dimension features and shape features of the workpieces according to an embodiment of the present invention.

FIG. 7 is a block figure of an apparatus for generating machining codes of workpieces from a paper engineering drawing according to an embodiment of the present invention.

FIG. 8 is a detailed block figure of the pre-pressing unit according to an embodiment of the present invention.

FIG. 9 is a detailed block figure of the extracting unit according to an embodiment of the present invention.

The same or similar reference signs in accompanying drawings denote same or similar elements.

DETAILED DESCRIPTION OF THE EXAMPLE EMBODIMENTS

Figure 10:
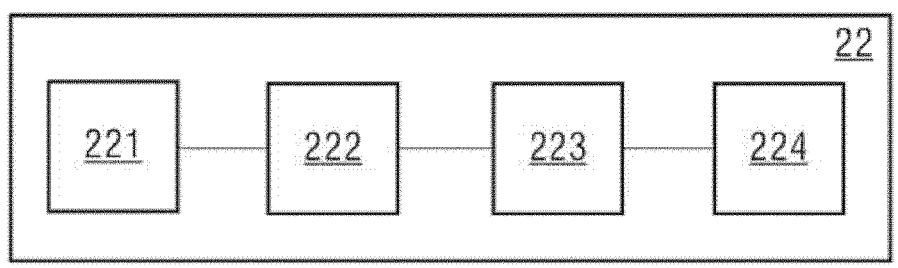
FIG. 10 is a detailed block figure of the extracting unit according to another embodiment of the present invention.

In order to make the objects, technical solutions and advantages of the present invention more evident, detailed description of example embodiment (s) in conjunction with accompanying drawings is provided here below.

Embodiments of the present invention are described in detail here below, wherein examples of the embodiments are illustrated in the drawings; in which same or similar reference signs throughout denote same or similar elements or elements have same or similar functions. It should be appreciated that the embodiments described below in conjunction with the drawings are illustrative and are provided for explaining the present invention only, thus shall not be interpreted as limits to the present invention.

Various embodiments or examples are provided here below to implement different structures of the present invention. To simplify disclosure of the present invention, descriptions of components and arrangements of specific examples are given below. Of course, they are illustrative only and are not intended to limit the present invention. Moreover, in the present invention, reference numbers and/or letters may be repeated in different embodiments. Such repetition is for purposes of simplicity and clarity, yet does not denote any relationship between respective embodiments and/or arrangements under discussion. Furthermore, the present invention provides various examples for various processes and materials. However, it is obvious for a person of ordinary skill in the art that other processes and/or materials may be utilized alternatively. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other. It is noteworthy that the components shown in the drawings are not necessarily drawn to scale. Description of conventional components, processing technologies and crafts are omitted herein in order not to limit the present invention unnecessarily.

As shown in FIG. 2, an embodiment of the present invention provides a method 1 for generating machining codes of workpieces from a paper engineering drawing.

The paper engineering drawing may be a paper drawing illustrating dimension, shape of workpieces and mutual relationship among the workpieces in a product or device, which is used for manufacture of the product or device. Workpieces may be components in the product or device. Machining codes refer to codes which represent the dimension and shape of workpieces, and upon being input to a CNC machine, cause the CNC machine to manufacture workpieces with such dimension and shape.

FIG. 1 illustrates a computer numerical control (CNC) system according to an embodiment of the present invention, which comprises a CNC machine 12 and a camera terminal 11 connected thereto.

The method 1 for generating machining codes of workpieces from a paper engineering drawing may be performed in the CNC machine 12. In such a case, the camera terminal 11 only takes a photo of the paper engineering drawing for use by the CNC machine 12 in performing the method 1 for generating machining codes of workpieces from a paper engineering drawing according to an embodiment of this invention.

Alternatively, the method 1 for generating machining codes of workpieces from a paper engineering drawing may be performed in camera terminal 11, which may be a cell phone or a computer with a camera, etc. The camera terminal 11 takes a photo of the paper engineering drawing and performs the method 1 for generating machining codes of workpieces from a paper engineering drawing according to an embodiment of this invention. The generated machining codes of workpieces are input to the CNC machine 12 for manufacturing the workpieces according to the machining codes.

In step S1, the paper engineering drawing is processed to be a binary image.

The binary image may be an image each pixel of which is a pure black pixel (R=G=B=maximum) or a pure white pixel (R=G=B=0).

FIG. 3 is a detailed flow chart of step 1 according to an embodiment of the present invention.

In sub-step S11, an RGB image of the paper engineering drawing is obtained.

In case that the method 1 for generating machining codes of workpieces from a paper engineering drawing is performed in the camera terminal 11, the RGB image (i.e. a photo) of the paper engineering drawing is obtained by a camera in the camera terminal 11. In case that the method 1 for generating machining codes of workpieces from a paper engineering drawing is performed in the CNC machine 12, the RGB image of the paper engineering drawing is obtained by an interface in the CNC machine 12 which interfaces with the camera terminal 11.

In sub-step S12, the RGB image is converted to a gray level image.

In the RGB image, each pixel has an R color value, a G color value, and a B color value, and the pixel value thereof is indicated by (R, G, B). In the gray level image, each pixel thereof is indicated by (R', G', B'), wherein R'=G'=B'= (R+G+B)/3=0.333R+0.333G+0.333B. By this way, the RGB image can be converted to a gray level image.

In the sub-step S13, the gray level image is converted to the binary image by comparing gray levels of pixels in the gray level image with a gray level threshold, and converting pixels with gray levels above the gray level threshold to pure black pixels while converting pixels with gray levels below the gray level threshold to pure white pixels.

The gray level threshold can be generated by different threshold generation algorithms, e.g. the balanced histogram thresholding. Please refer to http://en.wikipedia.org/wiki/Balanced_histogram_thresholding for the balanced histogram thresholding.

As the RGB image of the paper engineering drawing has been converted to the binary image, interference caused by colors of pixels are removed, and thus the dimension features and shape features of the workpieces can be extracted well.

It is appreciated that, step S2 can be performed by ways other than that in FIG. 3. For example, it can be ruled that, if any of R color value, G color value and B color value of a pixel exceeds a certain threshold, the pixel is assumed as a pure black pixel, otherwise a pure white pixel. However, the method in FIG. 3 can improve accuracy of generating machining codes of workpieces from a paper engineering drawing.

In step S2, the dimension features and shape features of the workpieces are extracted from the binary image.

The shape features of the workpieces may be features about shape of each segment in the outline of a workpiece. A line function of a segment in a pre-determined planar co-ordinate system is different from that of another segment next thereto in the pre-determined planar co-ordinate system. For example, a workpiece comprises a long pole and a half-circle head connected to the long pole. The outline of the long pole is a long rectangle which has 4 straight-line edges each of which can be expressed as a unique linear function expression. The arc of the half-circle head can be expressed as a unique function expression. The bottom of the half-circle head, i.e. the diameter, can be expressed as a unique linear function expression. So, in this example, the segments comprise 4 edges of the long rectangle, the arc of the half-circle head, and the bottom of the half-circle head. The line function of each segment is function expression of that segment in a pre-determined planar coordinate system.

The dimension features of a workpiece comprise dimension characters and dimension lines. A dimension character may be a character indicating dimension of a segment in the workpiece, e.g. 0.6 cm. A dimension line may be an arrow line beside the dimension character, indicating which segment of the outline of the workpiece has the dimension indicated by the dimension character.

FIG. 4 is a detailed flow chart of step S2 according to an embodiment of the present invention.

In sub-step S21, dimension features of the workpieces are recognized from the binary image.

For example, optical character recognition (OCR) is used to recognize the dimension characters in the binary image. For example, U.S. Pat. No. 7,454,063 B1 discloses a method for automatically recognizing dimension characters from the electrical engineering drawing by way of a computer. Dimension lines can be recognized by way of OCR as well.

In sub-step S22, the recognized dimension features are removed from the binary image.

In an embodiment, upon recognizing the dimension features, the dimension characters and dimension lines are removed from the binary image together. In another embodiment, after the dimension features are recognized, the dimension characters are removed from the binary image, and after the shape features of the workpieces are recognized in later step S34, the dimension lines are removed from the binary image.

In step S24, shape features of the workpieces are recognized from the remaining binary image with the recognized dimension features removed.

In an embodiment, the shape features of the workpieces comprise line functions and endpoints of segments. Endpoints of a segment are two points at the both ends of the segment, usually expressed as coordinates in that pre-determined planar coordinate system.

The method of recognizing a line function of a segment in a binary image includes e.g. Hough Transform. Refer to http://en.wikipedia.org/wiki/Hough_transform.

The method of recognizing endpoints of a segment in a binary image includes e.g. a Corner Detection algorithm. Refer to http://en.wikipedia.org/wiki/Corner_detection.

In the above embodiment, a line function and endpoints of a segment are used to define the segment, but in other embodiments, other features can be used to define the segment. For example, if the outline of a workpiece is composed of only straight lines, only the endpoints of the straight lines can be used to define the shape features of the workpiece, so the shape features of the workpiece only comprise endpoints of the segments. And, if the outline of a workpiece is composed of straight lines and curves with fixed radius of curvature, endpoints of the straight lines and curves and the radii of curvature of the curves are used to define the shape features of the workpiece, so the shape features of the workpieces comprise endpoints of the straight lines and curves and the radii of curvature of the curves. However, a line function and endpoints of a segment is more general, and can improve accuracy of processing by accurately expressing local shapes of the outline of the workpiece.

FIG. 5 is a detailed flow chart of step S2 according to another embodiment of the present invention.

As compared to FIG. 4, sub-step S23 of shrinking widths of lines in the remaining binary image with the recognized dimension features removed to a pixel width is added in FIG. 5. Please refer to Digital Image Processing, Third Edition, by Rafael C. Gonzalez and Richard E. Woods.

The benefit thereof is to improve accuracy of recognizing the shape features of a workpiece. Because all the widths of lines are shrinked to a pixel width, the line function of segments can be determined accurately.

In step S3, the machining codes of the workpieces are generated based on the extracted dimension features and shape features of the workpieces.

FIG. 6 is a detailed block figure of step S3 according to an embodiment of the present invention.

In sub-step S31, the extracted dimension features and shape features of the workpieces are interpreted.

The extracted dimension features and shape features of the workpieces are interpreted according to general rules for engineering drawings. For example, when two arcs each with an arrow outward and sandwiching a value are extracted, the value sandwiched by the two arcs is interpreted as an angle.

In sub-step S32, the machining codes of workpieces are generated based on interpretation of the extracted dimension feature and shape features of the workpieces. This is a general function of a computer aid manufacture (CAM) software.

As shown in FIG. 7, according to an embodiment of the present invention, there is provided an apparatus 2 for generating machining codes of workpieces from a paper engineering drawing, the machining codes indicating dimension and shape of workpieces, the apparatus 2 comprising a processing unit 21, an extracting unit 22 and a generating unit 23. The processing unit 21 is configured to process the paper engineering drawing to be a binary image. The extracting unit 22 is configured to extract dimension features and shape features of the workpieces from the binary image. The generating unit 23 is configured to generate the machining codes of the workpieces based on the extracted dimension features and shape features of the workpieces. Each unit in the apparatus 2 can be realized by software, hardware (e.g. integrated circuit, FPGA, etc.) or combination thereof.

Optionally, as shown in FIG. 8, the processing unit 21 comprises an obtaining sub-unit 211 configured to obtain an RGB image of the paper engineering drawing, a first converting sub-unit 212 configured to convert the RGB image to a gray level image, and a second converting sub-unit 213 configured to convert the gray level image to the binary image by comparing gray levels of pixels in the gray level image with a gray level threshold, and converting pixels with gray levels above the gray level threshold to pure black pixels while converting pixels with gray levels below the gray level threshold to pure white pixels.

Optionally, as shown in FIG. 9, the extracting unit 22 comprises a first recognizing sub-unit 221 configured to recognize dimension features of the workpieces from the binary image, a removing sub-unit 222 configured to remove the recognized dimension features from the binary image, and a second recognizing sub-unit 224 configured to recognize shape features of the workpieces from the remaining binary image with the recognized dimension features removed.

Optionally, as shown in FIG. 10, the extracting unit 22 further comprises a shrinking sub-unit 223 configured to shrink widths of lines in the remaining binary image with the recognized dimension features removed to a pixel width.

Optionally, the shape features of the workpieces comprise line functions and endpoints of segments, wherein outline of a workpiece is divided into segments, and a line function of a segment is different from that of another segment next thereto.

Figure 11:
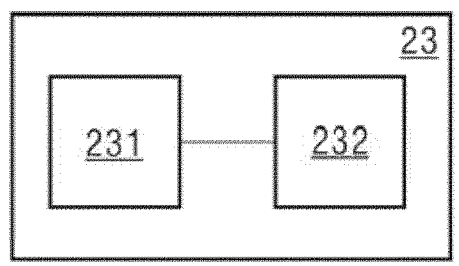
FIG. 11 is a detailed block figure of the generating unit according to another embodiment of the present invention.

Optionally, as shown in FIG. 11, the generating unit 23 comprises an interpreting sub-unit 231 configured to interpret the extracted dimension features and shape features of the workpieces, a generating sub-unit 232 configured to generate the machining codes of workpieces based on interpretation of the extracted dimension feature and shape features of the workpieces.

Figure 12:
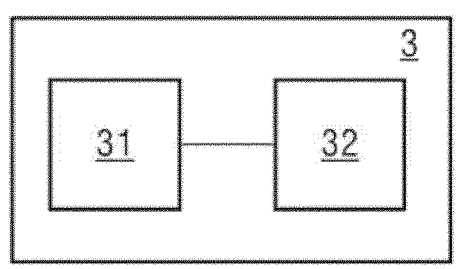
FIG. 12 is a structure figure of a device for generating machining codes of workpieces from a paper engineering drawing according to an embodiment of the present invention.

FIG. 12 illustrates a device 3 for generating machining codes of workpieces from a paper engineering drawing according to an embodiment of the present invention. In case that the method 1 for generating machining codes of workpieces from a paper engineering drawing is performed in the camera terminal 11, the device 3 for generating machining codes of workpieces from a paper engineering drawing is the camera terminal 11. In case that the method 1 for generating machining codes of workpieces from a paper engineering drawing is performed in the CNC machine 12, the device 3 for generating machining codes of workpieces from a paper engineering drawing is the CNC machine 12.

The device 3 for generating machining codes of workpieces from a paper engineering drawing may include a storage 31 for storing executable instructions, and a processor 32 for performing operations in the above method 1 for generating machining codes of workpieces from a paper engineering drawing according to the executable instructions stored in the storage 31.

Further, an embodiment of the present invention provides a machine readable medium with executable instructions stored thereon which, when executed, enables a machine to perform operations in the above method 1 for generating machining codes of workpieces from a paper engineering drawing.

Although the example embodiments and their advantages have been described at length herein, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for generating machining codes of workpieces from a paper engineering drawing, the machining codes indicating dimension and shape of the workpieces, the method comprising:
  processing a photo of the paper engineering drawing captured by at least one imaging device to create a binary image;
  extracting dimension features and shape features of the workpieces from the binary image; and
  generating the machining codes of the workpieces based on the extracted dimension features and shape features of the workpieces,
  wherein the processing the photo of the paper engineering drawing comprises:
  obtaining a red, green, blue (RGB) image of the paper engineering drawing;
  converting the RGB image to a gray level image;
  converting the gray level image to the binary image by comparing gray levels of pixels in the gray level image with a gray level threshold, and converting pixels with gray levels above the gray level threshold to pure black pixels and converting pixels with gray levels below the gray level threshold to pure white pixels,
  wherein the extracting of the dimension features and shape features comprises:
  identifying dimension features of the workpieces from the binary image;
  removing the recognized dimension features from the binary image; and
  identifying shape features of the workpieces from a remaining portion of the binary image after the recognized dimension features are removed,
  wherein the shape features of the workpieces include line functions and endpoints of segments, wherein an outline of a workpiece is divided into segments, and a line function of a segment is different from a line function of a neighboring segment.

2. The method of claim 1, wherein the extracting of the dimension features and shape features further comprises:
  shrinking widths of lines in the remaining portion of the binary image with the recognized dimension features removed to a pixel width.

3. The method of claim 1, wherein the generating of the machining codes of the workpieces comprises:
  interpreting the extracted dimension features and shape features of the workpieces; and
  generating the machining codes of the workpieces based on the interpreting of the extracted dimension feature and shape features of the workpieces.

4. An apparatus for generating machining codes of workpieces from a paper engineering drawing, the machining codes indicating a dimension and shape of the workpieces, the apparatus comprising:
  a processor configured to execute computer-readable instructions such that, when executed by the computer, cause the computer to,
  process a photo of the paper engineering drawing captured by at least one imaging device to create a binary image,
  extract dimension features and shape features of the workpieces from the binary image, and
  generate the machining codes of the workpieces based on the extracted dimension features and shape features of the workpieces,
  wherein the processor is configured to execute computer-readable instructions to
  obtain a red, green, blue (RGB) image of the paper engineering drawing,
  convert the RGB image to a gray level image, and
  convert the gray level image to the binary image by comparing gray levels of pixels in the gray level image with a gray level threshold, configured to convert pixels with gray levels above the gray level threshold to pure black pixels and configured to convert pixels with gray levels below the gray level threshold to pure white pixels,
  wherein the processor is configured to execute computer-readable instructions to,
  identify dimension features of the workpieces from the binary image,
  remove the recognized dimension features from the binary image, and
  identify shape features of the workpieces from a remaining portion of the binary image after the recognized dimension features are removed,
  wherein the shape features of the workpieces include line functions and endpoints of segments, wherein an outline of at least one of the workpieces is divided into segments, and a line function of a segment is different from a line function of a neighboring segment.

5. The apparatus of claim 4, wherein the processor is configured to execute computer-readable instructions to, shrink widths of lines in the remaining portion of the binary image with the recognized dimension features removed to a pixel width.

6. The apparatus of claim 4, wherein the processor is configured to execute computer-readable instructions to
interpret the extracted dimension features and shape features of the workpieces, and
generate the machining codes of the workpieces based on the interpretation of the extracted dimension feature and shape features of the workpieces.

7. A device for generating machining codes of workpieces from a paper engineering drawing, comprising:
a storage to store executable instructions and
a processor configured to execute the executable instructions stored in the storage to
process a photo of the paper engineering drawing captured by at least one imaging device to create a binary image;
extract dimension features and shape features of the workpieces from the binary image; and
generate the machining codes of the workpieces based on the extracted dimension features and shape features of the workpieces,
wherein the processing the photo of the paper engineering drawing comprises:
obtaining a red, green, blue (RGB) image of the paper engineering drawing;
converting the RGB image to a gray level image;
converting the gray level image to the binary image by comparing gray levels of pixels in the gray level image with a gray level threshold, and converting pixels with gray levels above the gray level threshold to pure black pixels and converting pixels with gray levels below the gray level threshold to pure white pixels,
wherein the extracting of the dimension features and shape features comprises:
identifying dimension features of the workpieces from the binary image;
removing the recognized dimension features from the binary image; and
identifying shape features of the workpieces from a remaining portion of the binary image after the recognized dimension features are removed, and
wherein the shape features of the workpieces include line functions and endpoints of segments, wherein an outline of a workpiece is divided into segments, and a line function of a segment is different from a line function of a neighboring segment.

8. A non-transitory machine readable medium with executable instructions stored thereon which, when executed, enable a machine to perform the method of claim 1.

9. A non-transitory machine readable medium with executable instructions stored thereon which, when executed, enable a machine to perform the method of claim 1.

10. The method of claim 1, further comprising:
machining a workpiece based on the generated machining codes.

* * * * *